United States Patent
Omoto et al.

(10) Patent No.: US 11,437,565 B2
(45) Date of Patent: Sep. 6, 2022

(54) PIEZOELECTRIC ELEMENT AND LIQUID EJECTING HEAD

(71) Applicant: Seiko Epson Corporation, Tokyo (JP)

(72) Inventors: Masayuki Omoto, Chino (JP); Ichiro Asaoka, Suwa (JP); Hiromu Miyazawa, Azumino (JP)

(73) Assignee: Seiko Epson Corporation

( * ) Notice: Subject to any disclaimer, the term of this patent is extended or adjusted under 35 U.S.C. 154(b) by 1045 days.

(21) Appl. No.: 16/114,286

(22) Filed: Aug. 28, 2018

(65) Prior Publication Data

US 2019/0067557 A1 Feb. 28, 2019

(30) Foreign Application Priority Data

Aug. 29, 2017 (JP) .............................. JP2017-163922

(51) Int. Cl.
  *B41J 2/14* (2006.01)
  *H01L 41/187* (2006.01)
  *H01L 41/08* (2006.01)
  *H01L 41/318* (2013.01)
  *H01L 41/09* (2006.01)

(52) U.S. Cl.
  CPC ........ *H01L 41/187* (2013.01); *B41J 2/14233* (2013.01); *H01L 41/0805* (2013.01); *H01L 41/1876* (2013.01); *B41J 2002/14241* (2013.01); *B41J 2002/14419* (2013.01); *B41J 2202/03* (2013.01); *H01L 41/0973* (2013.01); *H01L 41/318* (2013.01)

(58) Field of Classification Search
  None
  See application file for complete search history.

(56) References Cited

U.S. PATENT DOCUMENTS

| 6,543,107 | B1* | 4/2003 | Miyashita | ............. | H01L 41/318 |
| | | | | | 156/89.11 |
| 7,918,542 | B2 | 4/2011 | Sakashita et al. | | |
| 8,210,658 | B2 | 7/2012 | Arakawa et al. | | |
| 2016/0064646 | A1 | 3/2016 | Kawada et al. | | |
| 2018/0145246 | A1* | 5/2018 | Omoto | .................. | H01L 41/318 |

FOREIGN PATENT DOCUMENTS

| JP | 2001-223404 A | 8/2001 |
| JP | 4438893 B1 | 3/2010 |
| JP | 5290551 B2 | 9/2013 |
| WO | WO-2014-185379 A1 | 11/2014 |

* cited by examiner

*Primary Examiner* — Erica S Lin
(74) *Attorney, Agent, or Firm* — Harness, Dickey & Pierce, P.L.C.

(57) ABSTRACT

A piezoelectric element including an electrode and a piezoelectric layer provided on the electrode and having a perovskite structure including lead, zirconium, and titanium is provided. A radial distribution function obtained from an extended X-ray absorption fine structure of an L3 absorption edge of lead in an X-ray absorption spectrum of the piezoelectric layer at an interface with the electrode satisfies a formula (1) below $$A/B \leq 1 \qquad (1)$$

(in the formula (1), A represents an intensity of a peak attributable to oxygen atoms closest to lead atoms; and B represents an intensity of a peak attributable to oxygen atoms second closest to the lead atoms).

10 Claims, 10 Drawing Sheets

FIG. 13

| | Pb MOLAR RATIO | FIRING TEMPERATURE (°C) | A/B | INITIAL BREAKING VOLTAGE BREAKING TIME (s) |
|---|---|---|---|---|
| EXAMPLE 1 | 1.14 | 650 | 0.72 | 31680 |
| EXAMPLE 2 | 1.18 | 725 | 0.78 | 10800 |
| EXAMPLE 3 | 1.20 | 725 | 0.84 | 7200 |
| COMPARATIVE EXAMPLE 1 | 1.18 | 747 | 1.05 | 60 |

PIEZOELECTRIC ELEMENT AND LIQUID EJECTING HEAD

This application claims priority under 35 U.S.C. § 119 to Japanese Patent Application No. 2017-163922 filed on Aug. 29, 2017, the entire disclosure of which is expressly incorporated by reference herein.

BACKGROUND

1. Technical Field

The present invention relates to a piezoelectric element and a liquid ejecting head.

2. Related Art

A piezoelectric element typically includes a piezoelectric layer having an electromechanical conversion characteristic and two electrodes that sandwich the piezoelectric layer. As a device including such a piezoelectric element as a drive source, a liquid ejecting head typically used for an ink jet recording head is known.

For example, International Publication No. WO 2014/185379 discloses that a driving lifetime of a piezoelectric ceramic containing an alkaline niobate compound including Sn and Zr as a main component is improved by setting an intensity ratio between two peaks in a radial distribution function obtained from a K-edge X-ray absorption spectrum of Sn equal to or smaller than a predetermined value.

Lead zirconate titanate (PZT) has a high piezoelectric constant, and is preferably used for a piezoelectric layer of a piezoelectric element. One of piezoelectric properties is initial breakdown voltage breaking time (time from application of voltage to a plurality of piezoelectric elements to occurrence of the first short circuit in the plurality of piezoelectric elements), and it is required to elongate the initial breakdown voltage breaking time. However, what the initial breakdown voltage breaking time is correlated to has not been sufficiently revealed.

International Publication No. WO 2014/185379 discloses correlation with a drive lifetime by using the intensity of a peak in a radial distribution function obtained from a K-edge X-ray absorption spectrum of Sn as an index. However, when the material system is different, correlation between the index and various properties is also different, and thus it is expected that, even if the index disclosed in International Publication No. WO 2014/185379 is applied to a PZT system without any modification, it is difficult to elongate the initial breakdown voltage breaking time. Therefore, it is important to find new correlation with a PZT system. For example, an X-ray absorption spectrum changes depending on the position in the thickness direction of the piezoelectric layer, and selection of a target element and an absorption edge thereof is important.

SUMMARY

One of advantages according to some aspects of the invention is to provide a piezoelectric element having a long initial breakdown voltage breaking time. In addition, one of advantages according to some aspects of the invention is to provide a liquid ejecting head including the piezoelectric element mentioned above.

The invention is made to solve at least part of the problems described above, and can be implemented as following embodiments.

An aspect of the piezoelectric element according to the invention includes a piezoelectric element including an electrode and a piezoelectric layer provided on the electrode and having a perovskite structure including lead, zirconium, and titanium is provided, and a radial distribution function obtained from an extended X-ray absorption fine structure of an L3 absorption edge of lead in an X-ray absorption spectrum of the piezoelectric layer at an interface between with the electrode satisfies a formula (1) below $$A/B \leq 1 \tag{1}$$

(in the formula (1), A represents an intensity of a peak attributable to oxygen atoms closest to lead atoms; and B represents an intensity of a peak attributable to oxygen atoms second closest to the lead atoms).

Such a piezoelectric element has a long initial breakdown voltage breaking time (see "Examples" that will be described later for details).

The piezoelectric element according to the invention may satisfy a formula (2) below $$0.6 \leq A/B \leq 0.85 \tag{2}.$$

Such a piezoelectric element has a longer initial breakdown voltage breaking time (see "Examples" that will be described later for details).

In the piezoelectric element according to the invention, a distance between the lead atoms and the oxygen atoms closest to the lead atoms may be in a range from 1.2 Å to 1.6 Å, and a distance between the lead atoms and the oxygen atoms second closest to the lead atoms may be in a range from 1.8 Å to 2.2 Å.

In such a piezoelectric element, when a peak is within a range from 1.2 Å to 1.6 Å, the peak can be identified as a peak attributable to oxygen atoms positioned closest to lead atoms. Further, in a radial distribution function obtained from such a piezoelectric element, when a peak is within a range from 1.8 Å to 2.2 Å, the peak can be identified as a peak attributable to oxygen atoms positioned second closest to lead atoms.

In the piezoelectric element according to the invention, a thickness of the piezoelectric layer may be equal to or smaller than 2 μm.

In such a piezoelectric element, for example, a diaphragm can be more efficiently displaced than in the case where the thickness of the piezoelectric layer is larger than 2 μm.

In the piezoelectric element according to the invention, the piezoelectric layer may be constituted by a plurality of thin film layers.

The initial breakdown voltage breaking time can be also elongated with such a piezoelectric element (see "Examples" that will be described later for details).

A liquid ejecting head according to an aspect of the invention includes the piezoelectric element according to the invention.

Such a liquid ejecting head has high reliability due to the piezoelectric element according to the invention.

BRIEF DESCRIPTION OF THE DRAWINGS

The invention will be described with reference to the accompanying drawings, wherein like numbers reference like elements.

FIG. 13 is a table showing a relationship between A/B and initial breakdown voltage breaking time.

DESCRIPTION OF EXEMPLARY EMBODIMENTS

A preferable embodiment of the invention will be described in detail with reference to drawings. To be noted, the embodiment that will be described later should not unreasonably limit the scope of the invention described in claims. In addition, not all elements that will be described below are always required for the invention.

1. Piezoelectric Element

1.1. Configuration

Figure 1:
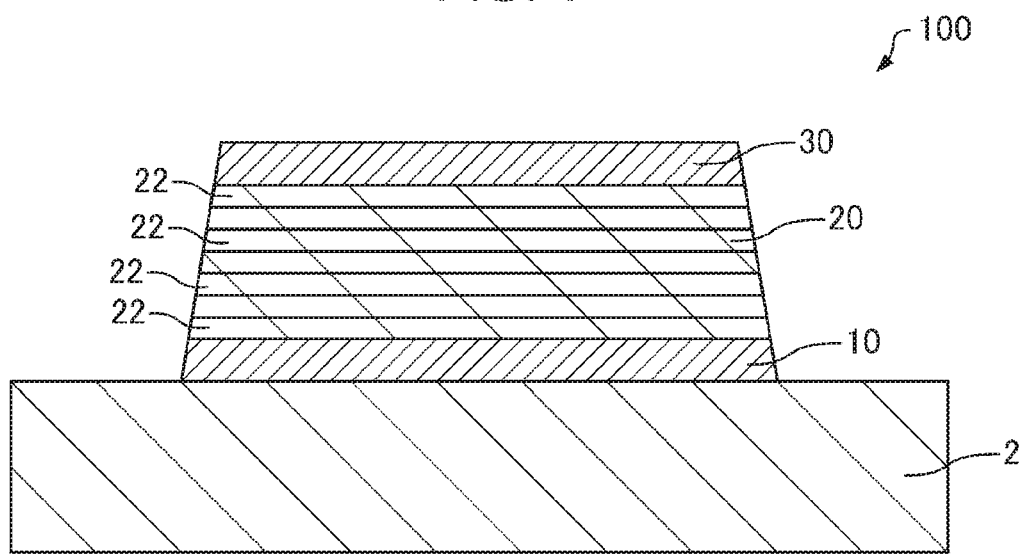
FIG. 1 is a schematic section view of a piezoelectric element according to an embodiment.

First, a piezoelectric element according to the present embodiment will be described with reference to drawings. FIG. 1 is a schematic section view of a piezoelectric element 100 according to the present embodiment.

As illustrated in FIG. 1, the piezoelectric element 100 includes a first electrode 10, a piezoelectric layer 20, and a second electrode 30. The piezoelectric element 100 is formed on, for example, a substrate 2.

For example, the substrate 2 is a flat plate formed from semiconductor, insulator, or the like. The substrate 2 may be a single layer or have a structure in which a plurality of layers are laminated. The inner structure of the substrate 2 is not limited as long as the top surface thereof is flat. For example, the substrate 2 may have a structure in which a space or the like is provided therein.

The substrate 2 may include a diaphragm that is flexible and can be deformed (bent) by a function of the piezoelectric layer 20. Examples of the diaphragm include a silicon oxide layer, a zirconium oxide layer, and a laminate of these.

The first electrode 10 is provided on the substrate 2. The shape of the first electrode 10 is, for example, a layer shape. The thickness of the first electrode 10 is, for example, 50 nm to 300 nm. Examples of the first electrode 10 include metal layers such as an iridium layer and a platinum layer, layers of conductive oxides of these (for example, an iridium oxide layer), and a strontium ruthenate (SrRuO$_x$:SRO) layer. The first electrode 10 may have a structure in which a plurality of the layers exemplified above are laminated.

The first electrode 10 and the second electrode 30 are a pair of electrodes, and the first electrode 10 is one (lower electrode provided under the piezoelectric layer 20) of the pair of electrodes for applying voltage to the piezoelectric layer 20.

Although not illustrated, a firm contact layer for improving the firmness of contact of the first electrode 10 and the substrate 2 may be provided between the first electrode 10 and the substrate 2. Examples of the firm contact layer include a titanium layer and a titanium oxide layer.

The piezoelectric layer 20 is provided on the first electrode 10. For example, the thickness of the piezoelectric layer 20 is 100 nm to 3 μm, preferably 100 nm to 2 μm, and more preferably 100 nm to 700 nm.

The piezoelectric layer 20 has a perovskite structure including lead (Pb), zirconium (Zr), and titanium (Ti). Specifically, the piezoelectric layer 20 is a lead zirconate titanate (Pb(Zr,Ti)O$_3$:PZT) layer. The piezoelectric layer 20 can be deformed by applying voltage between the first electrode 10 and the second electrode 30.

The piezoelectric layer 20 is constituted by, for example, a plurality of thin film layers 22. The plurality of thin film layers 22 are formed by repeating a series of steps a plurality of times. The series of steps include a step (application step) of applying and forming a precursor layer that is to be a thin film layer 22, a step (drying step) of drying the precursor layer, a step (degreasing step) of degreasing the precursor layer that has been dried, and a step (firing step) of firing the precursor layer that has been degreased to crystallize the precursor layer. One thin film layer 22 is formed by one cycle of the series of steps. The number of the plurality of thin film layers 22 is, for example, 2 to 10, and is 7 in the illustrated example. The thickness of one thin film layer 22 is, for example, 20 nm to 200 nm.

The second electrode 30 is provided on the piezoelectric layer 20. The shape of the second electrode is, for example, a layer shape. The thickness of the second electrode 30 is, for example, 50 nm to 300 nm. Examples of the second electrode 30 include metal layers such as an iridium layer and a platinum layer, layers of conductive oxides of these (for example, an iridium oxide layer), and a strontium ruthenate layer. The second electrode 30 may have a structure in which a plurality of the layers exemplified above are laminated.

The first electrode 10 and the second electrode 30 are a pair of electrodes, and the second electrode 30 is the other (upper electrode provided under the piezoelectric layer 20) of the pair of electrodes for applying voltage to the piezoelectric layer 20.

For example, the piezoelectric element 100 may be applied to a liquid ejecting head or a printer including the liquid ejecting head as a piezoelectric actuator for pressurizing a liquid in a pressure generating chamber, or may be used for other applications such as a piezoelectric sensor (ultrasonic sensor or gyro sensor) that detects deformation of the piezoelectric layer as an electric signal.

To be noted, although a side surface of the first electrode 10 and a side surface of the piezoelectric layer 20 are continuous in the example shown in FIG. 1, the width (size in a direction perpendicular to the thickness direction of the substrate 2) of the first electrode 10 may be smaller than the width of the piezoelectric layer 20, and the side surface of the first electrode 10 may be covered by the piezoelectric layer 20. In this case, the second electrode 30 may cover the side surface of the piezoelectric layer 20 and may be provided on the substrate 2.

1.2. Radial Distribution Function of Piezoelectric Layer

A radial distribution function can be obtained by performing Fourier transform on an extended X-ray absorption fine structure (EXAFS) spectrum. Hereinafter, an EXAFS spectrum and a radial distribution function will be described.

When a monochromatic X-ray is transmitted through a substance, the X-ray absorbance of the substance can be obtained from the intensity (incident X-ray intensity: 10) of an X-ray incident on the substance and the intensity (transmitted X-ray intensity: It) of the X-ray transmitted through the substance. An X-ray absorption spectrum with an x axis corresponding to the energy of the incident X-ray and a y axis corresponding to the X-ray absorbance can be obtained by changing the energy of the monochromatic X-ray incident on the substance, that is, the energy (eV) of the incident X-ray while monitoring the X-ray absorbance.

In an X-ray absorption spectrum, there is a point where the X-ray absorbance suddenly increases, and the value of the x axis at this point is referred to as an absorption edge. An absorption edge is unique to an element constituting the substance. A fine vibration structure appearing in a region corresponding to an energy higher than the absorption edge by about 20 eV to 1000 eV in the X-ray absorption spectrum is referred to as an EXAFS, and a spectrum thereof is referred to as an EXAFS spectrum.

When Fourier transform is performed on an EXAFS spectrum, a radial distribution function centered on an X-ray absorbing atom (atom of interest) can be obtained. Information such as a distance from X-ray absorbing atoms to X-ray scattering atoms (atoms in the vicinity of the X-ray absorbing atoms) and the number of the X-ray scattering atoms can be obtained from the radial distribution function, and thus information of the vicinity of atoms of interest can be obtained.

In the invention, a radial distribution function is obtained from an L3 absorption edge of lead included in the piezoelectric layer 20. Therefore, in the invention, a radial distribution function having an x axis corresponding to a distance from lead atoms (interatomic distance) and a y axis corresponding to intensity (intensity after Fourier transform) can be obtained.

A radial distribution function obtained from an EXAFS of the L3 absorption edge of lead in an X-ray absorption spectrum obtained at an electrode interface of the piezoelectric layer 20 (interface between the piezoelectric layer 20 and the first electrode 10) satisfies the formula (1) below, preferably satisfies the formula (2) below, and further preferably satisfies the formula (3) below.

@@@

$$A/B \leq 1 \qquad (1)$$

$$0.6 \leq A/B \leq 0.85 \qquad (2)$$

$$0.6 \leq A/B \leq 0.8 \qquad (3)$$

To be noted, in the formulae (1) to (3), A represents an intensity of a peak a attributable to oxygen atoms closest to lead atoms, and B represents an intensity of a peak b attributable to oxygen atoms second closest to the lead atoms (see "Examples" that will be described later for peaks in a specific radial distribution function). To be noted, the "intensity of a peak" corresponds to a local maximum of the intensity of the radial distribution function.

Figure 2:
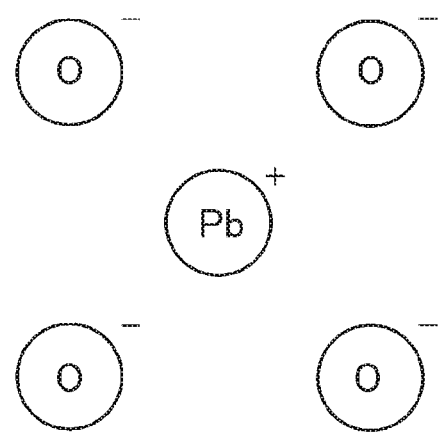
FIG. 2 is a diagram for describing the distance between lead atoms and oxygen atoms in PZT.
Figure 3:
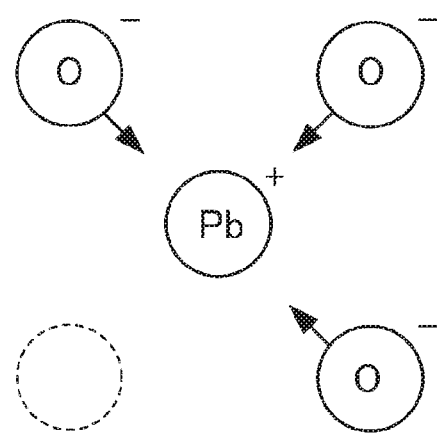
FIG. 3 is a diagram for describing the distance between lead atoms and oxygen atoms in PZT.

Here, FIGS. 2 and 3 are diagrams for describing the distance between lead atoms and oxygen atoms in PZT.

Lead atoms have positive charge and oxygen atoms have negative charge. As illustrated in FIG. 2, oxygen atoms are positioned at a certain distance from lead atoms such that the piezoelectric layer 20 is neutral as a whole. The peak b in the radial distribution function is attributable to the oxygen atoms in a state illustrated in FIG. 2, and B in the formulae (1) to (3) represents an intensity of the peak b.

For example, in the case where one oxygen atom is released (oxygen defect occurs) and the state illustrated in FIG. 2 changes to a state illustrated in FIG. 3, the amount of negative charge decreases. Therefore, the oxygen atoms come closer to the lead atoms to keep the piezoelectric layer 20 neutral as a whole. The peak a in the radial distribution function is attributable to the oxygen atoms in the state illustrated in FIG. 3, and A in the formulae (1) to (3) represents an intensity of the peak a. That is, a large A value indicates that there are many oxygen defects. FIG. 3 illustrates an oxygen defect by a broken line.

In the piezoelectric layer 20, a distance between the lead atoms and the oxygen atoms closest to the lead atoms are, for example, 1.2 Å to 1.6 Å, preferably 1.3 Å to 1.5 Å, and more preferably 1.4 Å. Further, in the piezoelectric layer 20, a distance between the lead atoms and oxygen atoms second closest to the lead atoms are, for example, 1.8 Å to 2.2 Å, preferably 1.9 Å to 2.1 Å, and more preferably 1.8 Å. The distance between the lead atoms and the oxygen atoms closest to the lead atoms and the distance between the lead atoms and the oxygen atoms second closest to the lead atoms can be derived from the radial distribution function (see "Examples" that will be described later for details).

1.3. Features

The piezoelectric element 100 has, for example, the following features.

In the piezoelectric element 100, the radial distribution function obtained from an EXAFS of the L3 absorption edge of lead in an X-ray absorption spectrum obtained at the electrode interface of the piezoelectric layer 20 (interface with the first electrode 10) satisfies the formula (1) above, preferably satisfies the formula (2) above, and more preferably satisfies the formula (3) above. A/B of the formulae (1) to (3) was found to have correlation with the initial breakdown voltage breaking time of the piezoelectric element (see "Examples" that will be described later for details). The piezoelectric element 100 satisfies the formulae (1) to (3) and therefore has a long initial breakdown voltage breaking time.

In the piezoelectric element 100, the distance between the lead atoms and the oxygen atoms closest to the lead atoms may be in a range from 1.2 Å to 1.6 Å, and the distance between the lead atoms and the oxygen atoms second closest to the lead atoms may be in a range from 1.8 Å to 2.2 Å. Therefore, in a radial distribution function obtained from the piezoelectric element 100, when a peak is within the range from 1.2 Å to 1.6 Å, the peak can be identified as a peak attributable to oxygen atoms positioned closest to lead atoms. Further, in a radial distribution function obtained from the piezoelectric element 100, when a peak is within a range from 1.8 Å to 2.2 Å, the peak can be identified as a peak attributable to oxygen atoms positioned second closest to lead atoms.

In the piezoelectric element 100, the thickness of the piezoelectric layer 20 may be equal to or smaller than 2 μm. Therefore, in the piezoelectric element 100, for example, a diaphragm can be more efficiently displaced than in the case where the thickness of the piezoelectric layer 20 is larger than 2 μm.

In the piezoelectric element 100, the piezoelectric layer 20 is constituted by the plurality of thin film layers 22. Here, A/B that has correlation with the initial breakdown voltage breaking time was found to have correlation with the amount of lead in the vicinity of the interface with the first electrode 10 (see "Examples" that will be described later for details).

Lead moves in the solid in the firing step. Therefore, in the case where the piezoelectric layer 20 is constituted by the plurality of thin films 22, the amount of lead in the piezoelectric layer 20 at the interface with the first electrode 10 is difficult to estimate because the firing step is repeated as many times as the number of the thin film layers 22. However, even in the case where it is difficult to estimate the amount of lead in the piezoelectric layer in this manner, the initial breakdown voltage breaking time of the piezoelectric element 100 can be elongated by producing the piezoelectric element 100 such that A/B satisfies the formula (1) above (see "Examples" that will be described later for details).

2. Production Method of Piezoelectric Element

Figure 4:
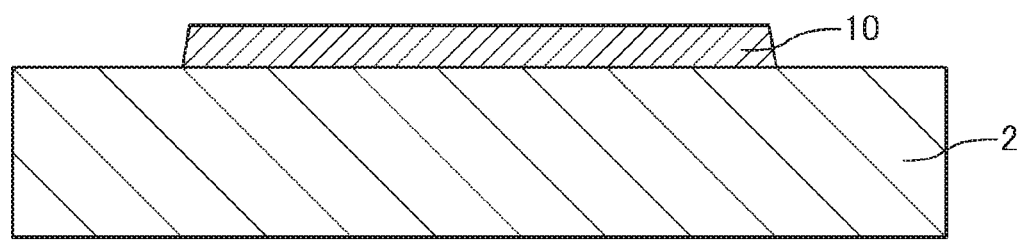
FIG. 4 is a schematic section view of the piezoelectric element according to the embodiment schematically illustrating a production process thereof.

Next, a production method of the piezoelectric element 100 according to the present embodiment will be described with reference to drawings. FIG. 4 is a schematic section view of the piezoelectric element 100 according to the present embodiment schematically illustrating a production process thereof.

As illustrated in FIG. 4, the substrate 2 is prepared. Specifically, a silicon oxide layer is formed by thermally oxidizing a silicon substrate. Next, a zirconium layer is formed on the silicon oxide layer by a sputtering method or the like, and a zirconium oxide layer is formed by oxidizing the zirconium layer. The substrate 2 can be prepared in accordance with the steps described above.

Next, the first electrode 10 is formed on the substrate 2. The first electrode 10 is formed by, for example, film formation by a sputtering method or a vacuum deposition method and patterning by photolithography and etching.

As illustrated in FIG. 1, the piezoelectric layer 20 is formed on the first electrode 10. The piezoelectric layer 20 is formed by, for example, a solution method such as a sol-gel method or metal organic deposition (MOD). The piezoelectric layer 20 is formed by repeating the series of steps including the application step, the drying step, the degreasing step, and the firing step a plurality of times.

For example, a specific procedure of forming the piezoelectric layer 20 by a solution method is as follows. First, a precursor solution containing predetermined metal complexes is prepared. The precursor solution is obtained by dissolving or dispersing, in an organic solvent, metal complexes that can form PZT by firing.

The prepared precursor solution is applied on the first electrode 10 by using a spin coating method to form a precursor layer (application step). Next, the precursor layer is heated to, for example, about 130° C. to 250° C. and dried for a certain period (drying step). Further, the dried precursor layer is degreased by heating the precursor layer and keeping the precursor layer at, for example, about 300° C. to 450° C. for a certain period (degreasing step). Next, the degreased precursor layer is crystallized by heating the precursor layer and keeping the precursor layer at, for example, about 650° C. to 800° C. for a certain period, and thus a thin film layer 22 is formed (firing step). Then, the application step, the drying step, the degreasing step, and the firing step are repeated a plurality of times, and thus the piezoelectric layer 20 constituted by the plurality of thin film layers 22 is formed.

Examples of a metal complex containing lead include lead acetate. Examples of a metal complex containing zirconium include zirconium acetylacetonate, zirconium tetraacetylacetonate, zirconium monoacetylacetonate, and zirconium bisacetylacetonate. Examples of a metal complex containing titanium include, for example, titanium alkoxides such as titanium isopropoxide. Examples of the solvent for the metal complexes include propanol, butanol, pentanol, hexanol, octanol, ethylene glycol, propylene glycol, octane, decane, cyclohexane, xylene, toluene, tetrahydrofuran, acetic acid, octylic acid, 2-n-butoxyethanol, n-octane, and mixture solvents of these.

The metal complexes are mixed such that, for example, the ratio (Pb/(Zr+Ti)) of the molar number of Pb with respect to the total molar number of Zr and Ti is 1.1 to 1.25. That is, the metal complexes are mixed such that the ratio of molar number satisfies Pb:(Zr+Ti)=1.1 to 1.25:1.

Examples of a heating apparatus used in the drying step, the degreasing step, and the firing step include a rapid thermal annealing apparatus that performs heating by radiation of infrared light and a hot plate.

Next, the piezoelectric layer 20 is subjected to patterning. The patterning is performed by, for example, photolithography and etching.

Next, the second electrode 30 is formed on the piezoelectric layer 20. The second electrode 30 is formed by, for example, a method similar to the first electrode 10.

The piezoelectric element 100 can be prepared in accordance with the steps described above.

3. Liquid Ejecting Head

Figure 5:
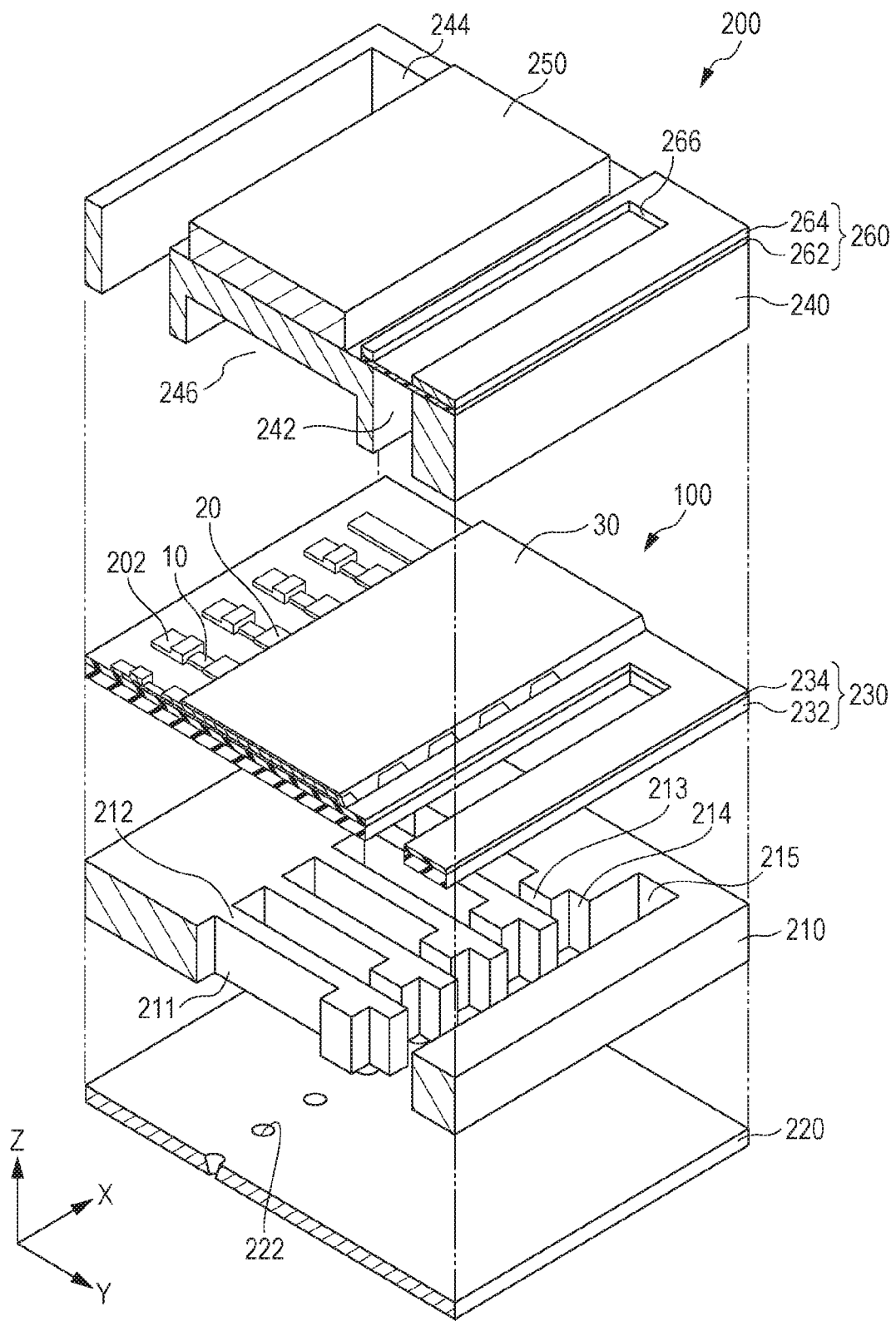
FIG. 5 is a schematic exploded perspective view of a liquid ejecting head according to the embodiment.
Figure 6:
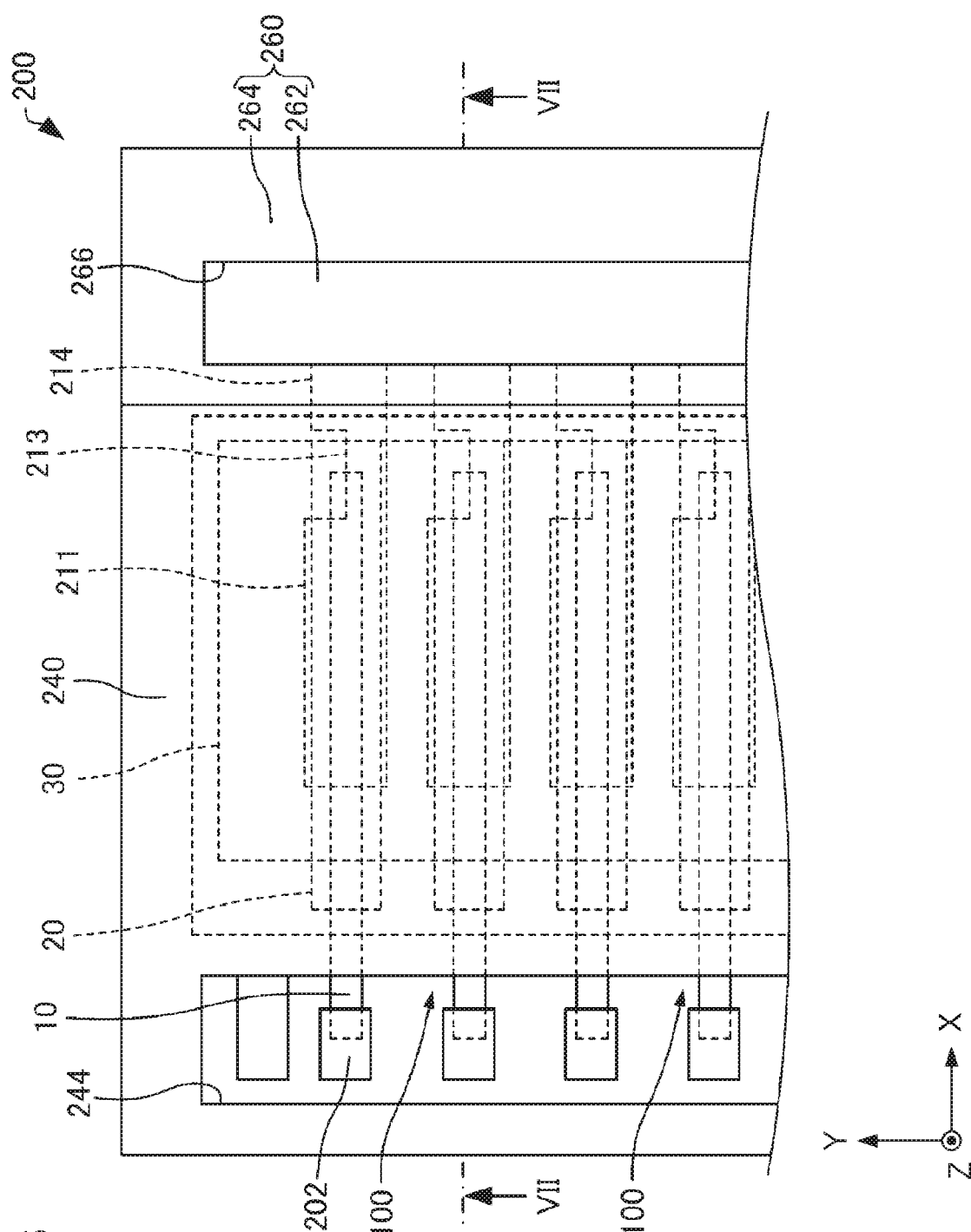
FIG. 6 is a schematic plan view of the liquid ejecting head according to the embodiment.
Figure 7:
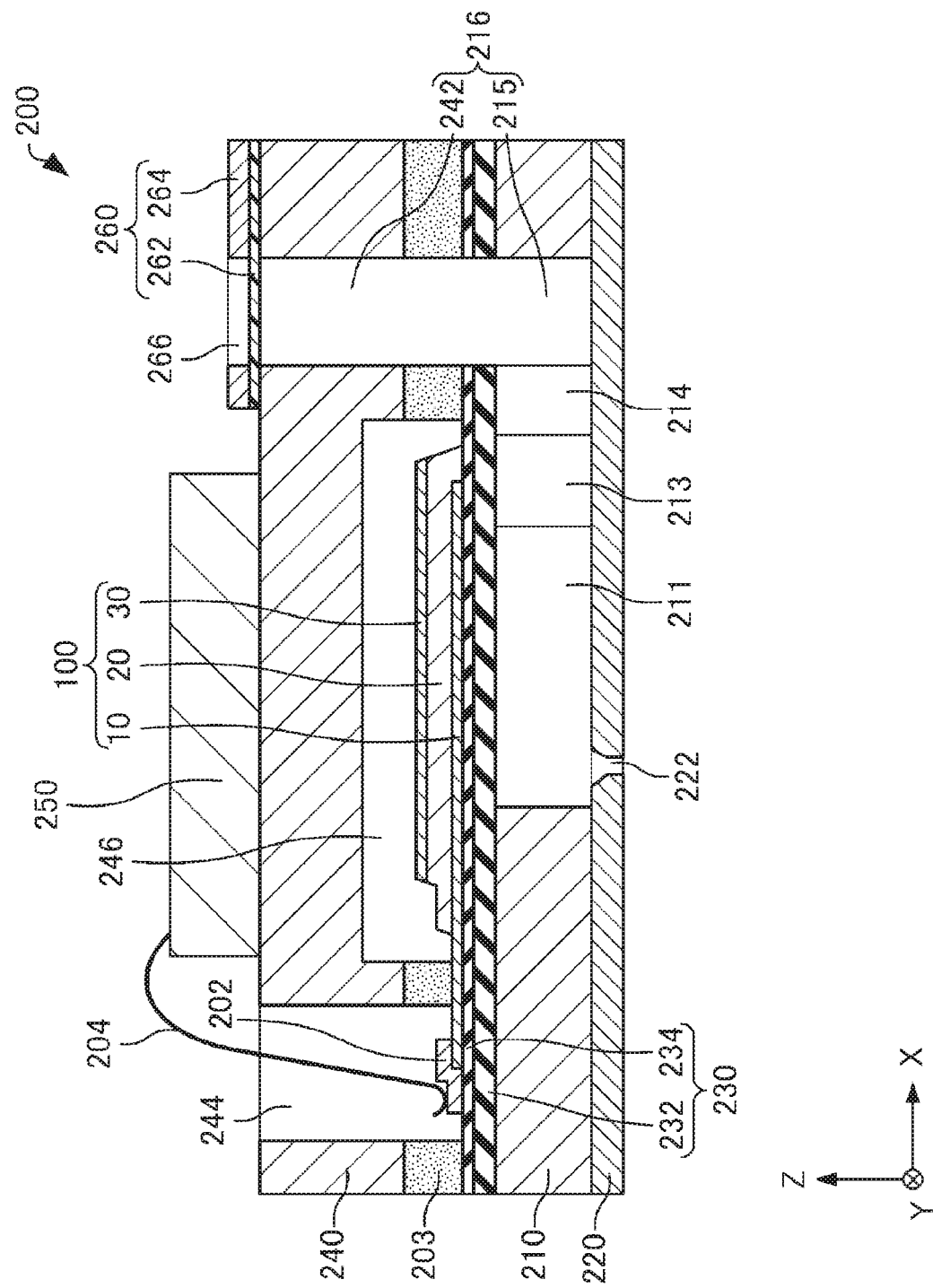
FIG. 7 is a schematic section view of the liquid ejecting head according to the embodiment.

Next, a liquid ejecting head according to the present embodiment will be described with reference to drawings. FIG. 5 is a schematic exploded perspective view of a liquid ejecting head 200 according to the present embodiment. FIG. 6 is a schematic plan view of the liquid ejecting head 200 according to the present embodiment. FIG. 7 is a schematic section view of the liquid ejecting head 200 according to the present embodiment taken along a line VII-VII of FIG. 6. To be noted, an X axis, a Y axis, and a Z axis are shown as three axes perpendicular to one another in FIGS. 5 to 7.

A liquid ejecting head according to the invention includes the piezoelectric element according to the invention. The liquid ejecting head 200 including the piezoelectric element 100 will be described below as an example. To be noted, in FIG. 7, the piezoelectric layer 20 of the piezoelectric element 100 is illustrated in a simplified manner for the sake of convenience.

As illustrated in FIGS. 5 to 7, the liquid ejecting head 200 includes, for example, the piezoelectric element 100, a channel-defining substrate 210, a nozzle plate 220, a diaphragm 230, a protective substrate 240, a circuit board 250, and a compliance substrate 260. To be noted, illustration of the circuit board 250 and connection wiring 204 is omitted in FIG. 6 for the sake of convenience.

The channel-defining substrate 210 is, for example, a silicon substrate. Pressure generating chambers 211 are provided in the channel-defining substrate 210. The pressure generating chambers 211 are partitioned by a plurality of partition walls 212.

In the channel-defining substrate 210, an ink supply path 213 and a communication path 214 are provided at an end portion of each of the pressure generating chambers 211 in a +X direction. The ink supply path 213 is defined such that the opening area thereof shrinks when the end portion of the pressure generating chamber 211 in the +X direction is squeezed in the Y axis direction. The size of the communication path 214 in the Y axis direction is, for example, the same as the size of the pressure generating chamber 211 in the Y axis direction. A communication portion 215 is provided on the +X side of the communication path 214. The communication portion 215 constitutes part of a manifold 216. The manifold 216 serves as a common ink chamber of the pressure generating chambers 211. As described above, liquid channels each including the pressure generating chamber 211, the ink supply path 213, the communication path 214, and the communication portion 215 are defined in the channel-defining substrate 210.

The nozzle plate 220 is provided on one surface (surface on the −Z side) of the channel-defining substrate 210. The material of the nozzle plate 220 is for example, steel use stainless (SUS). The nozzle plate 220 is joined to the channel-defining substrate 210 by, for example, a glue or a heat sealing film. Nozzle openings 222 are arranged along the Y axis in the nozzle plate 220. The nozzle openings 222 communicate with the pressure generating chambers 211.

The diaphragm 230 is provided on the other surface (surface on the +Z side) of the channel-defining substrate 210. The diaphragm 230 is constituted by, for example, a first insulator layer 232 formed on the channel-defining substrate 210 and a second insulator layer 234 provided on the first insulator layer 232. The first insulator layer 232 is, for example, a silicon oxide layer. The second insulator layer 234 is, for example, a zirconium oxide layer.

The piezoelectric element 100 is provided on, for example, the diaphragm 230. The piezoelectric element 100 is provided in a plural number. The number of the piezoelectric elements 100 is not particularly limited.

In the liquid ejecting head 200, the diaphragm 230 and the first electrodes 10 are displaced by deformation of the piezoelectric layers 20 having an electromechanical conversion characteristic. That is, in the liquid ejecting head 200, the diaphragm 230 and the first electrodes 10 substantially has a function as a diaphragm. To be noted, the diaphragm 230 may be omitted and the first electrodes 10 may be configured to function as a diaphragm by themselves. In the case of providing the first electrodes 10 directly on the channel-defining substrate 210, it is preferable to protect the first electrodes 10 by an insulating protective film or the like such that ink does not directly contact the first electrodes 10.

The first electrodes 10 are each configured as an individual electrode independent for each of the pressure generating chamber 211. The size of the first electrode 10 in the Y axis direction is, for example, smaller than the size of the pressure generating chamber 211 in the Y axis direction. The size of the first electrode 10 in the X axis direction is, for example, smaller than the size of the pressure generating chamber 211 in the X axis direction. Both end portions of the first electrode 10 in the X axis direction are positioned further on the outside than both end portions of the pressure generating chamber 211. A leading electrode 202 is connected to the end portion of the first electrode 10 on the −X side.

The size of the piezoelectric layer 20 in the Y axis direction is, for example, larger than the size of the first electrode 10 in the Y axis direction. The size of the piezoelectric layer 20 in the X axis direction is, for example, larger than the size of the pressure generating chamber 211 in the X axis direction. The end portion of the piezoelectric layer 20 on the +X side is, for example, positioned further on the outside (on the +X side) than the end portion of the first electrode 10 on the +X side. That is, the end portion of the first electrode 10 on the +X side is covered by the piezoelectric layer 20. Meanwhile, the end portion of the piezoelectric layer 20 on the −X side is, for example, positioned further on the inside (on the +X side) than the end portion of the first electrode 10 on the −X side. That is, the end portion of the first electrode 10 on the −X side is not covered by the piezoelectric layer 20.

The second electrode 30 is continuously provided on the piezoelectric layers 20, the first electrodes 10, and the diaphragm 230. The second electrode 30 is configured as a common electrode shared by the plurality of piezoelectric layers 20. To be noted, although not illustrated, the first electrode 10 instead of the second electrode 30 may be configured as a common electrode.

The protective substrate 240 is joined to the channel-defining substrate 210 by a glue 203. The protective substrate 240 is provided with a through hole 242. In the illustrated example, the through hole 242 penetrates through the protective substrate 240 in the Z axis direction and communicates with the communication portion 215. The through hole 242 and the communication portion 215 constitute the manifold 216 serving as a common ink chamber for the pressure generating chambers 211. Further, the protective substrate 240 is provided with a through hole 244 penetrating through the protective substrate 240 in the Z axis direction. End portions of the leading electrodes 202 are positioned at the through hole 244.

The protective substrate 240 is provided with an opening portion 246. The opening portion 246 is a space for not hindering driving of the piezoelectric elements 100. The opening portion 246 may be sealed or not sealed.

The circuit board 250 is provided on the protective substrate 240. The circuit board 250 includes a semiconductor integrated circuit (IC) for driving the piezoelectric elements 100. The circuit board 250 and the leading electrodes 202 are electrically interconnected via the connection wiring 204.

The compliance substrate 260 is provided on the protective substrate 240. The compliance substrate 260 includes a sealing layer 262 provided on the protective substrate 240 and a fixing board 264 provided on the sealing layer 262. The sealing layer 262 is a layer for sealing the manifold 216. For example, the sealing layer 262 is flexible. The fixing board 264 is provided with a through hole 266. The through hole 266 penetrates through the fixing board 264 in the Z axis direction. The through hole 266 is provided at such a position as to overlap the manifold 216 in plan view (as viewed in the Z axis direction).

The liquid ejecting head 200 includes the piezoelectric element 100 having a long initial breakdown voltage breaking time. Therefore, the liquid ejecting head 200 has high reliability.

4. Printer

Figure 8:
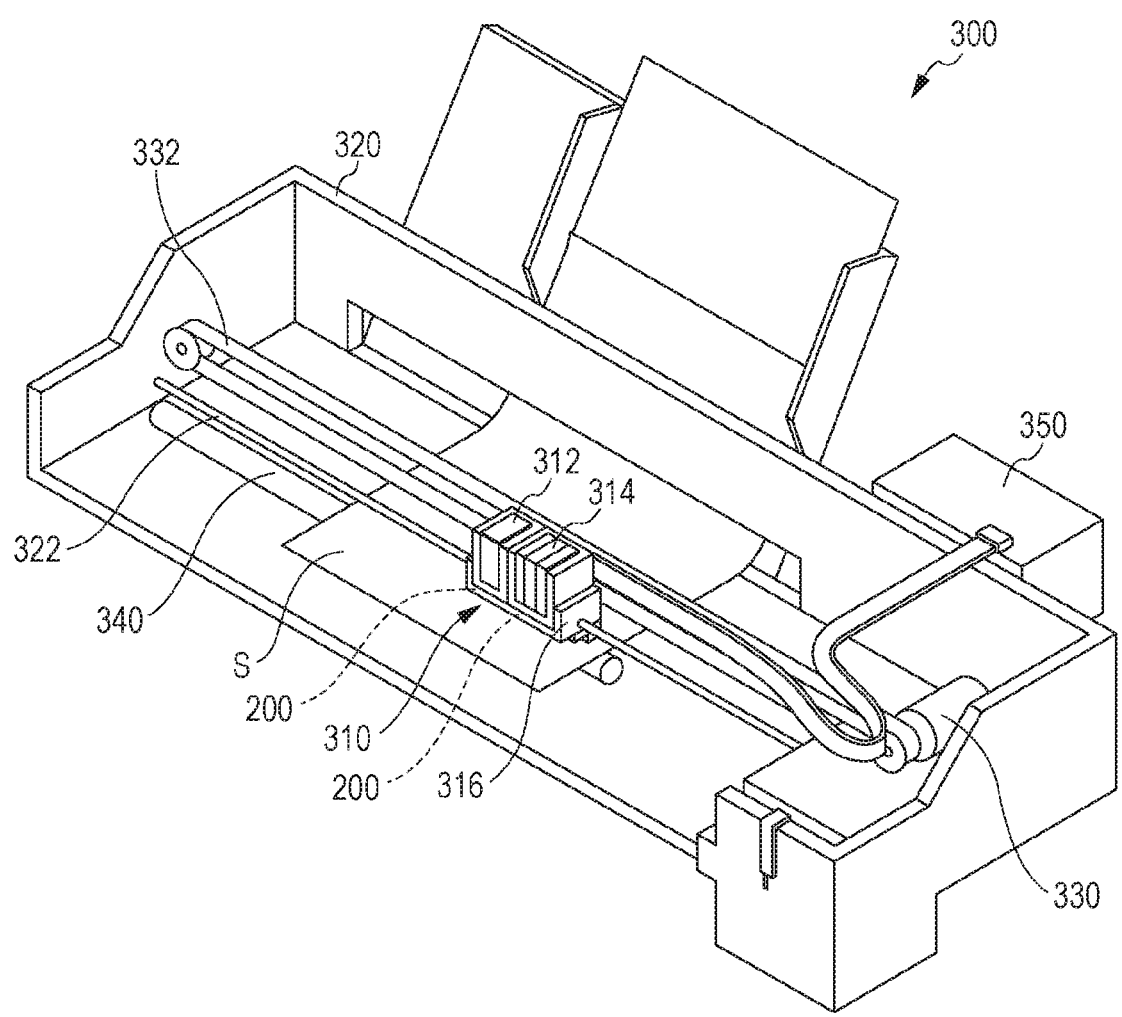
FIG. 8 is a schematic perspective view of a printer according to the embodiment.

Next, a printer according to the present embodiment will be described with reference to drawings. FIG. 8 is a schematic perspective view of a printer 300 according to the present embodiment.

A printer according to the invention includes the liquid ejecting head according to the invention. The printer 300 including the liquid ejecting head 200 will be described below as an example.

The printer 300 is an ink jet printer. As illustrated in FIG. 8, the printer 300 includes a head unit 310. The head unit 310 includes a plurality of liquid ejecting heads 200. The number of the liquid ejecting heads 200 is not particularly limited. Cartridges 312 and 314 constituting an ink supply unit are attachably and detachably provided in the head unit 310. A carriage 316 mounting the head unit 310 is provided, on a carriage shaft 322 attached to an apparatus body 320, so as to be movable in the shaft direction, and for example, ejects a black ink composition and color ink compositions.

In the printer 300, the carriage 316 mounting the head unit 310 is moved along the carriage shaft 322 as a result of driving force of a driving motor 330 being transmitted to the carriage 316 via a plurality of unillustrated gears and a timing belt 332. Meanwhile, the apparatus body 320 is provided with a transport roller 340 serving as a transport unit, and a recording sheet S that is a recording medium of paper or the like is transported by the transport roller 340. The transport unit that transports the recording sheet S is not limited to a transport roller, and may be a belt, a drum, or the like.

The printer 300 includes a printer controller 350. The printer controller 350 is electrically connected to the circuit board 250 (see FIG. 7) of the liquid ejecting head 200. The printer controller 350 includes, for example, a control unit, a driving signal generating circuit, and so forth. The control unit includes a random access memory (RAM) that temporarily stores various data, a read only memory (ROM) storing a control program and the like, a central processing unit (CPU), and so forth. The driving signal generating circuit generates a driving signal to be supplied to the liquid ejecting head 200.

The printer 300 includes the liquid ejecting head 200 having high reliability. Therefore, the printer 300 has high reliability.

5. Experimental Examples

The invention will be described more in detail with reference to the following experimental examples. To be noted, the invention should not be limited by the following experimental examples.

5.1. Preparation of Samples

A Si substrate was prepared, and a $SiO_2$ layer was formed by thermally oxidizing the Si substrate. Next, a Zr layer was formed on the $SiO_2$ layer by a sputtering method, and a $ZrO_2$ layer was formed by thermally oxidizing the Zr layer.

Next, a piezoelectric layer (PZT layer) was formed on the $ZrO_2$ layer by a sol-gel method. Specifically, a PZT layer consisting of 7 thin film layers was formed by repeating the application step, the drying step, the degreasing step, and the firing step 7 times. The thickness of one thin film layer was 100 nm, and the total thickness of the PZT layer was 700 nm. Three ratios (Pb/(Zr+Ti), hereinafter also referred to as "Pb molar ratio") of 1.14, 1.18, and 1.2 of the molar number of Pb with respect to the total molar number of Zr and Ti were used. Further, three temperatures of 650° C., 725° C., and 747° C. were used for the heating temperature (firing temperature) of the firing step. To be noted, a constant value of 3 minutes was used for the heating time (firing time) of the firing step.

Next, the PZT layer side was fixed to a SUS plate with the Si substrate side facing upward and the PZT layer facing downward. Next, the Si substrate was physically ground into a thickness of 30 nm or smaller, and then the Si substrate was removed by wet etching using NaOH. Since the ratio ($SiO_2$/Si) of etching speeds of NaOH for Si and $SiO_2$ is 1.4/1000, NaOH can selectively etch the Si substrate. In order to prevent penetration of NaOH from the side, the wet etching was performed with side surfaces of the Si substrate, the $SiO_2$ layer, the $ZrO_2$ layer, and the PZT layer covered with a glue.

Next, dry etching was performed to remove the $SiO_2$ layer and the $ZrO_2$ layer while checking the surface composition by X-ray photoelectron spectroscopy (XPS), and the surface of PZT that constituted the interface with the $ZrO_2$ layer was exposed.

5.2. Radial Distribution Function 5.2.1. Obtaining Method

A radial distribution function was obtained from an EXAFS of the L3 absorption edge of Pb in an X-ray absorption spectrum of the surface of the PZT layer exposed as described above.

Specifically, first, an X-ray absorption spectrum of Pb was obtained by using synchrotron radiation in an experiment station BL14B2 in Spring-8. Conversion electron yield method was used as a detection method.

Background noise was subtracted from the obtained X-ray absorption spectrum by a regular method. Next, a base line was set such that the average intensity in a range from −150 eV to −30 eV was 0 with the energy (E0) of the L3 absorption edge of Pb as the origin. In addition, a base line was set such that the average intensity in a range from +130 eV to +750 eV was 1. At this time, the two base lines were set such that the absorption edge energy (E0) was at the middle point between the two base lines in a spectrum of a rising portion in the vicinity of the absorption edge energy. Next, a line was drawn at the middle of a waving spectrum appearing on the higher energy side than E0, the energy (unit: eV) axis was replaced by a wavenumber (k, unit: 1/Å) axis with E0 as a zero point, and thus a vibration component$\times$(k) of the EXAFS was extracted.

Next, the spectrum obtained by the above operation was multiplied by $k^3$, and then Fourier transform was performed. "ATHENA package" was used as a computer program for the Fourier transform. The range of k in which Fourier transform was performed was set to 2 (1/Å) to 8.5 (1/Å). The k was set to 2 (1/Å) or larger so as to avoid the influence of the X-ray absorption spectrum. The k was set to 8.5 (1/Å) or smaller so as to avoid the influence of noise becoming greater as k became greater by cubing k.

Thus, a radial distribution function having a horizontal axis (x axis) corresponding to a distance from lead atoms (interatomic distance) and a vertical axis (y axis) corresponding to intensity (intensity after Fourier transform) was obtained.

5.2.2. Results

Figure 9:
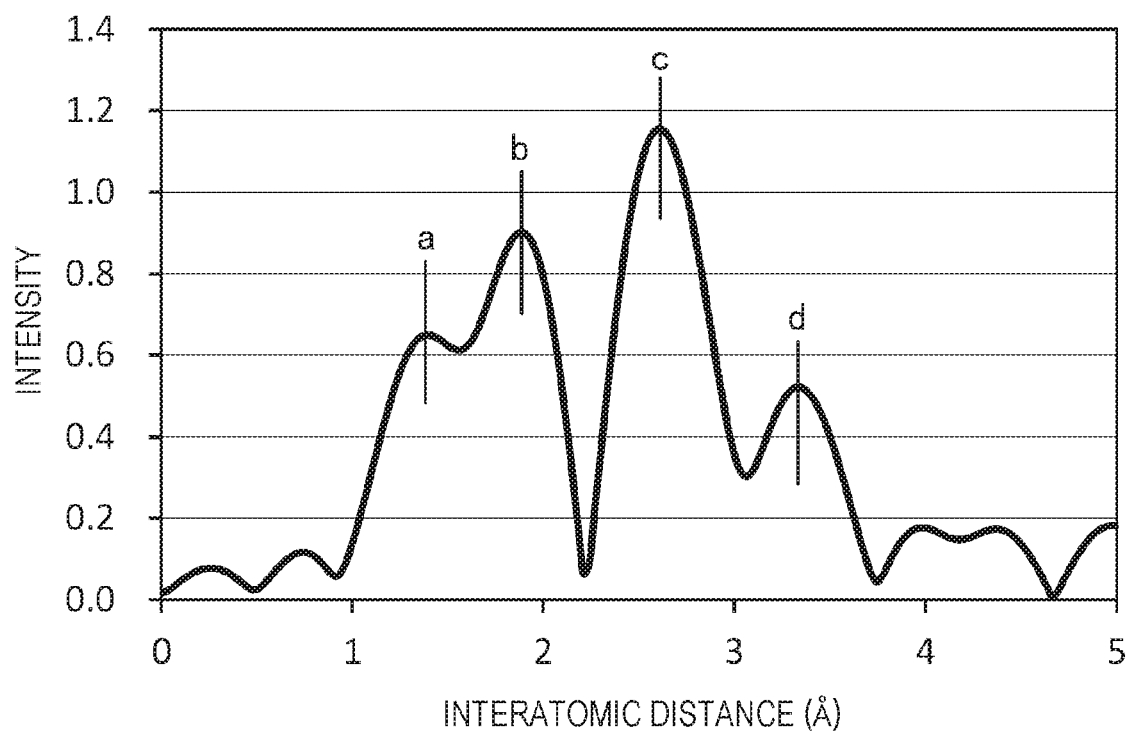
FIG. 9 is a graph showing a radial distribution function of Example 1.
Figure 10:
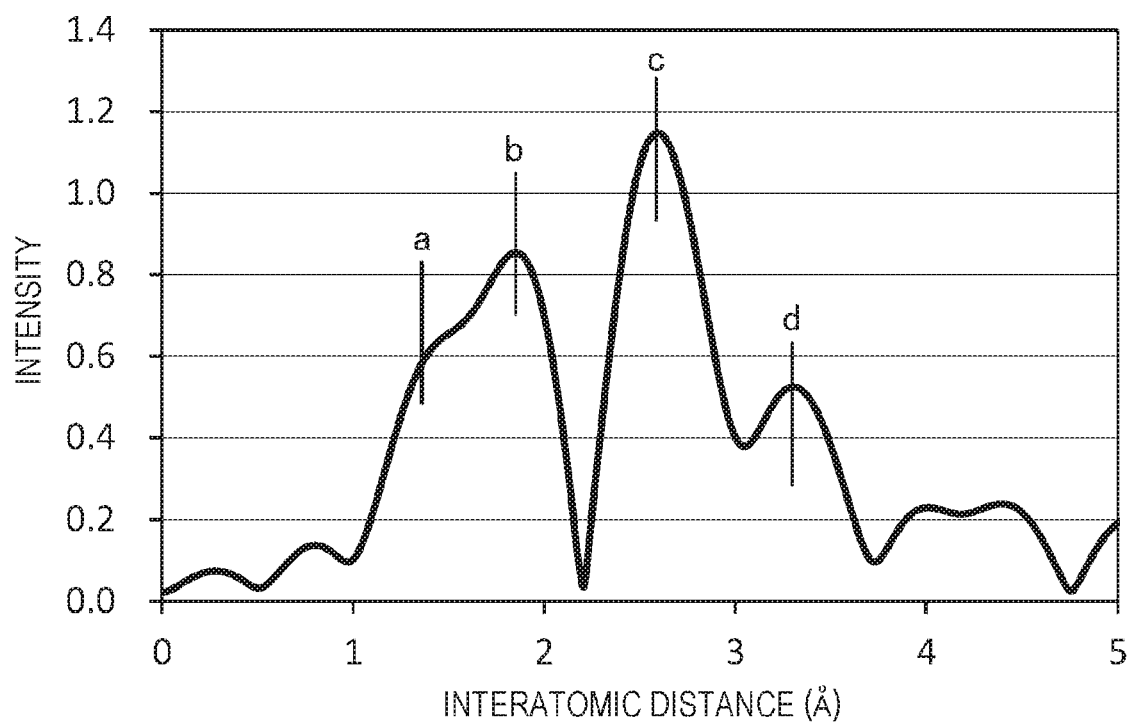
FIG. 10 is a graph showing a radial distribution function of Example 2.
Figure 11:
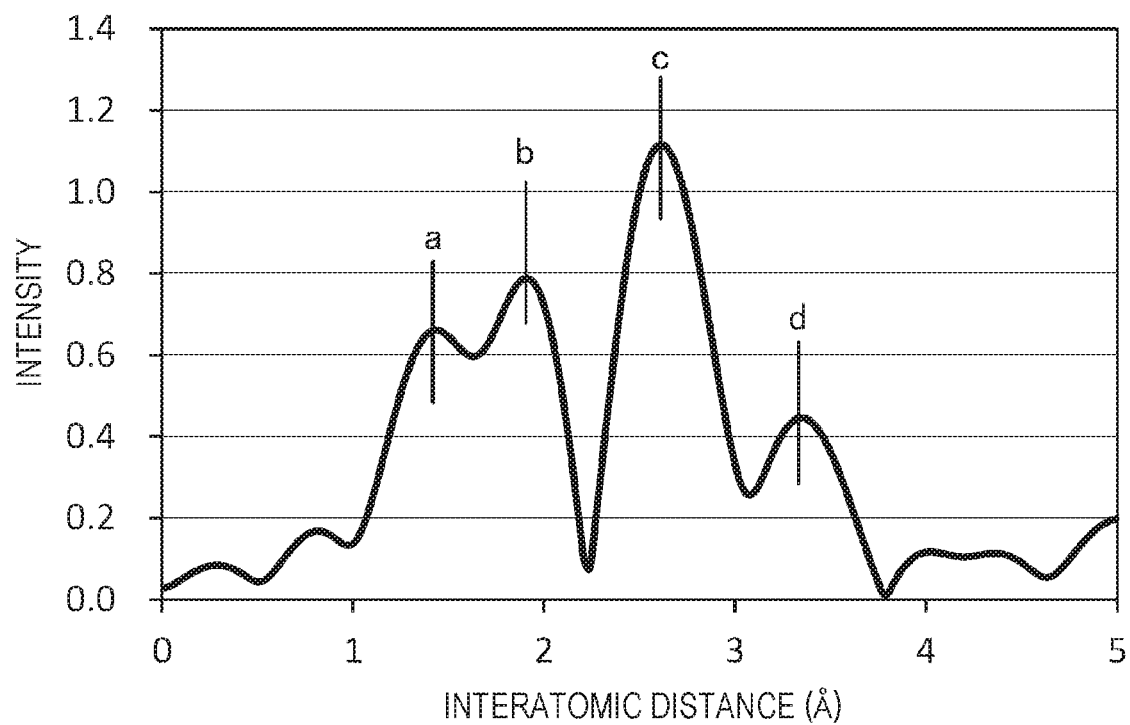
FIG. 11 is a graph showing a radial distribution function of Example 3.
Figure 12:
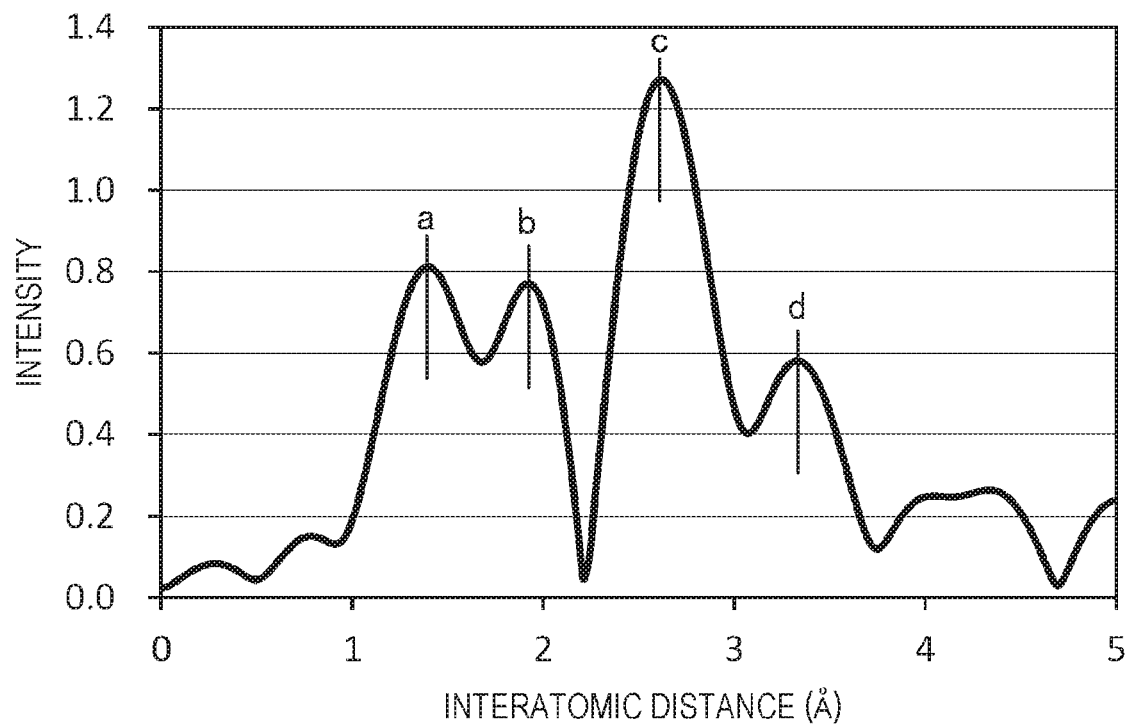
FIG. 12 is a graph showing a radial distribution function of Comparative Example 1.

Radial distribution functions of four samples of Example 1 (Pb molar ratio: 1.14, firing temperature: 650° C.), Example 2 (Pb molar ratio: 1.18, firing temperature: 725° C.), Example 3 (Pb molar ratio: 1.2, firing temperature 725° C.), and Comparative Example 1 (Pb molar ratio: 1.18, firing temperature: 747° C.) were obtained by the method described above. FIG. 9 is a graph showing a radial distribution function of Example 1. FIG. 10 is a graph showing a radial distribution function of Example 2. FIG. 11 is a graph showing a radial distribution function of Example 3. FIG. 12 is a graph showing a radial distribution function of Comparative Example 1.

As illustrated in FIGS. 9 to 12, four peaks were detected in a range from 1 Å to 4 Å of the interatomic distance (distance from Pb atoms). A peak a is a peak at 1.4 Å, a peak b is a peak at 2.0 Å, a peak c is a peak at 2.6 Å, and a peak d is a peak at 3.5 Å.

The peak b is a peak attributable to (derived from) oxygen (O) atoms bonding to Pb atoms. The peak a is a peak attributable to O atoms that have come closer to the Pb atoms than the positions of the peak b so as to increase the electrical stability as a result of the number of the O atoms bonding to the Pb atoms decreasing. That is, the peak a is a peak attributable to O atoms positioned closest to the Pb atoms. The peak b is a peak attributable to O atoms positioned second closest to the Pb atoms. In addition, the peak c is a peak attributable to O atoms positioned third closest to the Pb atoms. The peak d is a peak attributable to Zr and Ti at B sites of the perovskite structure.

Generally speaking, a peak at an interatomic distance smaller than 1 Å does not have physical importance. In addition, a peak at an interatomic distance larger than 4 Å is a peak in which peaks attributable to a plurality of kinds of atoms are superposed. Therefore, in the present experiment examples, focus is on peaks in the range from 1 Å to 4 Å.

In addition, although the peaks a, b, c, and d respectively appeared at 1.4 Å, 2.0 Å, 2.6 Å, and 3.5 Å in the present experiment, the positions of the peaks may be deviated in the range of ±0.2 Å due to an error of the apparatus. Therefore, the peak a attributable to the O atoms closest to the Pb atoms may appear in the range from 1.2 Å to 1.6 Å. The peak b attributable to the O atoms second closest to the Pb atoms may appear in the range from 1.8 Å to 2.2 Å.

5.3. Relationship Between Radial Distribution Function and Initial Breakdown Voltage Breaking Time A plurality of samples were prepared for each of Examples 1, 2, and 3 and Comparative Example 1 described above, and the initial breakdown voltage breaking time of the samples were measured by applying a direct current (DC) voltage of 27 V at a temperature of 50° C. Initial breakdown voltage breaking time is time at which the first sample breaks (shorts) among the plurality of samples to which voltage is applied.

Figure 14:
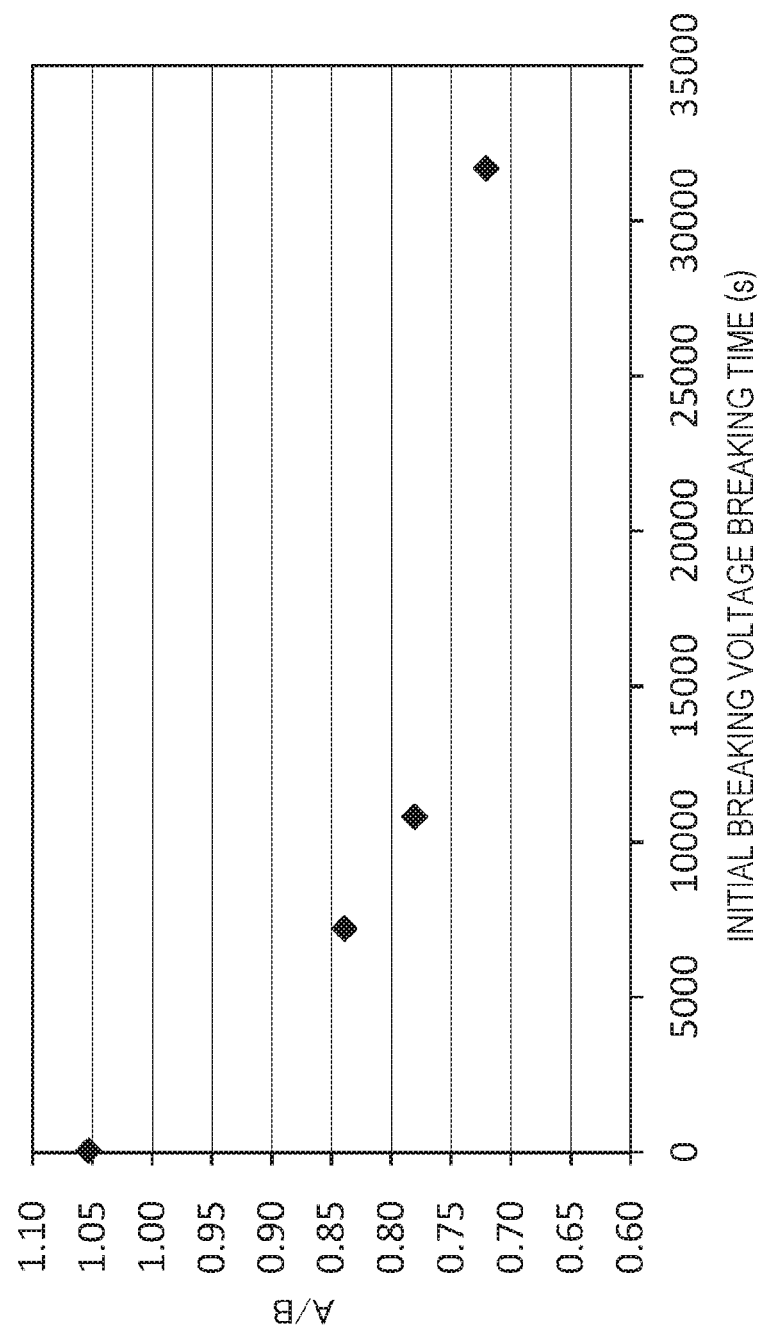
FIG. 14 is a graph showing a relationship between A/B and initial breakdown voltage breaking time.

FIG. 13 is a table showing a relationship between A/B and initial breakdown voltage breaking time for the samples of Examples 1, 2, and 3 and Comparative Example 1. FIG. 14 is a graph showing a relationship between A/B and initial breakdown voltage breaking time for the samples of Examples 1, 2, and 3 and Comparative Example 1. To be noted, "A" represents the intensity (local maximum) of the peak a, and "B" represents the intensity (local maximum) of the peak b.

As illustrated in FIGS. 13 and 14, the initial breakdown voltage breaking time shortened as the A/B increased. That is, it was found that A/B has correlation with the initial breakdown voltage breaking time.

As illustrated in FIG. 14, a sample having an A/B larger than 1 has initial breakdown voltage breaking time smaller than 1/100 of a sample having an A/B smaller than 1. Therefore, it was found that the initial breakdown voltage breaking time can be elongated by setting A/B to 1 or smaller, preferably to 0.6 to 0.85.

Oxygen has high electronegativity and a nature of attracting electron, and stabilizes the state of electrons in a valence band. Meanwhile, in a state where oxygen is defected, the energy of the valence band shifts to a shallower side, and thus the amount of free electrons increases when a potential is applied. When the amount of free electrons increase, the amount of charge that flows per unit time increases and thus the amount of current increases. Therefore, it can be considered that Joule heat increases as compared with a case without oxygen defect and voltage breakdown occurs.

Further, since the initial breakdown voltage breaking time is shorter for Comparative Example 1 with the highest firing temperature, it can be considered that the initial breakdown voltage breaking time is also related to the amount of lead (amount of lead at the interface) in the firing step. When the firing temperature is high, lead scatters in the solid, and the amount of lead at the interface decreases. Therefore, it can be said that A/B also has correlation with the amount of lead of the piezoelectric layer at the interface with the first electrode (lower electrode). The amount of lead of the piezoelectric layer at the interface with the first electrode depends on the firing time and the number of thin film layers constituting the piezoelectric layer in addition to the firing temperature of the firing step. For example, in the case where the piezoelectric layer is constituted by the plurality of thin films, the amount of lead in the piezoelectric layer at the interface with the first electrode is difficult to estimate because the firing step is repeated as many times as the number of the thin film layers. However, it was found that, even in the case where it is difficult to estimate the amount of lead in the piezoelectric layer in this manner, the initial breakdown voltage breaking time can be elongated by producing the piezoelectric element such that A/B satisfies the formula (1) above.

The invention includes configurations that are substantially the same as the configuration described in the embodiment (for example, configurations having the same functions, using the same methods, and having the same results, or configurations having the same object and the same effect). In addition, the invention includes configurations in which a portion that is not significant in the configuration described in the embodiment is replaced. In addition, the invention includes configurations that have the same effect as the configuration described in the embodiment and configurations that achieve the same object. In addition, the invention includes configurations in which a known technique is added to the configuration described in the embodiment.

What is claimed is:

1. A piezoelectric element comprising: an electrode; and a piezoelectric layer provided on the electrode and having a perovskite structure including lead, zirconium, and titanium, wherein a radial distribution function obtained from an extended X-ray absorption fine structure of an L3 absorption edge of lead in an X-ray absorption spectrum of the piezoelectric layer at an interface with the electrode satisfies a formula (1) below A/B≤1 ... (1), wherein in the formula (1), A represents an intensity of a peak attributable to oxygen atoms closest to lead atoms; and B represents an intensity of a peak attributable to oxygen atoms second closest to the lead atoms.

2. The piezoelectric element according to claim 1 satisfying a formula (2) below $$0.6 \leq A/B \leq 0.85 \qquad (2).$$

3. The piezoelectric element according to claim 1, wherein a distance between the lead atoms and the oxygen atoms closest to the lead atoms is in a range from 1.2 Å to 1.6 Å, and
wherein a distance between the lead atoms and the oxygen atoms second closest to the lead atoms is in a range from 1.8 Å to 2.2 Å.

4. The piezoelectric element according to claim 1, wherein a thickness of the piezoelectric layer is equal to or smaller than 2 μm.

5. The piezoelectric element according to claim 1, wherein the piezoelectric layer is constituted by a plurality of thin film layers.

6. A liquid ejecting head comprising the piezoelectric element according to claim 1.

7. A liquid ejecting head comprising the piezoelectric element according to claim 2.

8. A liquid ejecting head comprising the piezoelectric element according to claim 3.

9. A liquid ejecting head comprising the piezoelectric element according to claim 4.

10. A liquid ejecting head comprising the piezoelectric element according to claim 5.

* * * * *